(12) United States Patent
Yamamoto et al.

(10) Patent No.: US 9,739,849 B2
(45) Date of Patent: Aug. 22, 2017

(54) MAGNETIC FIELD DETECTING DEVICE

(71) Applicant: AICHI STEEL CORPORATION, Tokai-shi (JP)

(72) Inventors: Michiharu Yamamoto, Tokai (JP); Hideo Arakawa, Tokai (JP); Takeshi Kawano, Tokai (JP)

(73) Assignee: AICHI STEEL CORPORATION, Tokai-shi (JP)

( * ) Notice: Subject to any disclaimer, the term of this patent is extended or adjusted under 35 U.S.C. 154(b) by 10 days.

(21) Appl. No.: 14/603,833

(22) Filed: Jan. 23, 2015

(65) Prior Publication Data
US 2015/0219731 A1  Aug. 6, 2015

(30) Foreign Application Priority Data

Jan. 31, 2014 (JP) .................. 2014-018023

(51) Int. Cl.
*G01R 33/09* (2006.01)
*G01R 33/06* (2006.01)
(52) U.S. Cl.
CPC ........... *G01R 33/09* (2013.01); *G01R 33/063* (2013.01)
(58) Field of Classification Search
CPC .............................. G01R 33/09; G01R 33/063
See application file for complete search history.

(56) References Cited

U.S. PATENT DOCUMENTS

| 6,897,649 | B2 | 5/2005 | Kawase | |
| 7,405,559 | B1 * | 7/2008 | Hagerty | G01R 33/18 324/249 |

FOREIGN PATENT DOCUMENTS

| JP | 4-32787 A | | 2/1992 |
| JP | 04032787 A | * | 2/1992 |
| JP | 11-211774 A | | 8/1999 |
| JP | 2000-338207 A | | 12/2000 |
| JP | 2001-264400 A | | 9/2001 |
| JP | 2002-22705 A | | 1/2002 |
| JP | 2002-286821 A | | 10/2002 |

(Continued)

OTHER PUBLICATIONS

Office Action issued Oct. 6. 2015 in Japanese Patent Application No. 2014-018023 (with English language translation).

(Continued)

*Primary Examiner* — Julian Huffman
*Assistant Examiner* — Michael Konczal
(74) *Attorney, Agent, or Firm* — Oblon, McClelland, Maier & Neustadt, L.L.P.

(57) ABSTRACT

A magnetic field detecting device which comprises a magnetic impedance sensor including a magnetic impedance element 1 in which a pulse electrical current or a high frequency electrical current is applied from an oscillator 2 to an amorphous wire 10 and an alternate current or AC damped oscillation voltage, which is induced in a detecting coil 11 wound around the amorphous wire 10 and has a magnitude corresponding to an external magnetic field, is output, and an arbitrary magnetic field is applied to the amorphous wire by means of the magnetic field generated on the detecting coil 11 energized by connecting the detecting coil 11 to a voltage source or to a current source E through an impedance network 3 comprising of a resistor R or a coil L or a condenser C or comprising a combination of the resistor R, the coil L, and the condenser C.

4 Claims, 8 Drawing Sheets

(56) References Cited

FOREIGN PATENT DOCUMENTS

| | | | |
|---|---|---|---|
| JP | 2002286821 A | * | 10/2002 |
| JP | 2003-255029 A | | 9/2003 |
| JP | 2003255029 A | * | 9/2003 |
| JP | 2004-045246 A | | 2/2004 |
| JP | 2013-253919 A | | 12/2013 |

OTHER PUBLICATIONS

Office Action issued May 12, 2015 in Japanese Patent Application No. 2014-018023 (with English language translation).

K. Mohri, et al "Amorphous Wire and CMOS IC-Based Sensitive Micro-Magnetic Sensors (MI Sensor and SI Sensor) for Intelligent Measurements and Controls". Journal of Magnetism and Magnetic Materials 249 (2002) 351-356, pp. 54-59.

K. Mohri, et al., "Sensitive Micro Magnetic Sensor Family Utilizing Magneto-Impedance (MI) and Stress-Impedance (SI) Effects for Intelligent Measurements and Controls". Sensors and Actuators A91 (2001) 85-90, pp. 60-65.

* cited by examiner

MAGNETIC FIELD DETECTING DEVICE

TECHNICAL FIELD OF THE INVENTION

The present invention relates to a magnetic field detecting device suitable to measure strengths of a direct current and an alternate current magnetic field or to measure a magnetic variation and suitable to detect micro-magnets or the like.

PRIOR ART

A magnetic impedance sensor is capable of performing highly-sensitive magnetic detection, and hence is used as a sensor for a magnetic detecting device by which geomagnetism and its slight variation are observed, by which precise magnetic measurement is performed, and by which minute pieces of iron are inspected in physical/chemical/industrial fields {see Patent Literature 1 (Japanese Published Unexamined Patent Application No. 2003-121517), Non-Patent Literature 1 (Transistor Technology, December 2003 Issue, pages 138 to 142), exhibit}.

The magnetic impedance sensor, in which a pulse electrical current or a high frequency electrical current is applied to an amorphous wire of a magnetic impedance element of a magnetism-sensitive material having a detecting coil wound therearound, and thereafter detects and converts an alternate current damped oscillation voltage generated at both ends of the detecting coil in response to an external magnetic field around the amorphous wire is detected and converted into a voltage signal in response to the magnetism, outputs a voltage signal obtained by amplifying the voltage signal at a predetermined amplification degree.

However, for example, in a highly-sensitive magnetic field detecting device for observing a slight magnetic variation in geomagnetism, an average geomagnetic component is greatly larger than the geomagnetic variation, and therefore the detecting device is required to apply a bias magnetic field to the amorphous wire, which is used to cancel a mean-value component of geomagnetism, to the amorphous wire so that the output of the magnetic impedance sensor is not saturated with the mean-value component of geomagnetism. Therefore, there is a need to wind an another bias coil, which differs from the detecting coil, around the amorphous wire and to pass an electrical current that generates a magnetic field in a direction in which the average geomagnetic component is canceled, and therefore the magnetic impedance element is required to have two coils.

Additionally, for example, when the magnetic properties of magnetism to be detected are changed into only one of N or S and when the output of a signal is changed into only one of + (plus) or − (minus), it is effective to improve measuring accuracy by applying a magnetic bias to the amorphous wire and by shifting a 0 point to the side where magnetism to be detected does not change, and by fully using the linear area of the output of the magnetic sensor, i.e., fully using an effective amplitude. Likewise, in this case, the detecting device was required to have an another coil, which differs from the aforementioned detecting coil, to apply a desired magnetic bias.

When a more highly accurate magnetic field measuring device is made, it is an effective means to magnetically feed back a part of the output signal of the magnetic impedance sensor to the amorphous wire W and to perform measurement according to a zero method as shown in FIG. 13 and FIG. 14. Therefore, there is a need to wind a feedback coil FC, which differs from the detecting coil KC, around the amorphous wire W and to pass a feedback electrical current, and, in this case, the magnetic impedance element is likewise required to have two coils including the detecting coil. In recent years, a need for magnetic impedance sensors has risen, and it has become imperative to achieve production simplification and cost reduction.

SUMMARY OF THE INVENTION

Although two coils are needed in order to apply a bias magnetic field or in order to perform a feedback operation as described above by using a conventional magnetic impedance sensor of a detecting-coil output type, there has been a problem to develop electronic circuit technology that realizes a detecting-coil output type magnetic impedance sensor that is capable of applying a bias magnetic field or capable of improving accuracy through a feedback operation only by using a single coil in order to reduce production cost by reducing the number of components and the number of production process steps of the magnetic impedance element and by reducing the number of defective products while facilitating production.

The present invention has been made to solve the problem mentioned above, and it is an object of the present invention to provide a detecting-coil output type magnetic impedance sensor capable of applying a bias magnetic field and capable of improving accuracy through feedback only by using a single detecting coil.

To solve the above problem, the inventors of the present invention paid attention to the fact that it is possible to apply a magnetic field to an amorphous wire by the magnetic field generated in a single detecting coil by blocking the flow of an alternate current damped oscillation voltage and by applying an electrical current from a voltage source or from a current source to the detecting coil that detects the alternate current damped oscillation voltage induced in response to an external magnetic field around the amorphous wire and that is wound around the amorphous wire. Thus, the inventors of the present invention focused attention on the first technical idea of the present invention of applying a magnetic field to an amorphous wire by the magnetic field induced on a detecting coil by energizing the detecting coil through a decoupling circuit connected between a voltage source or a current source and the detecting coil, in a magnetic impedance sensor formed of a magnetic impedance element that passes a pulse electrical current or a high frequency electrical current through the amorphous wire and that outputs an alternate current damped oscillation voltage having a magnitude in response to an external magnetic field induced by the detecting coil wound around the amorphous wire.

Herein, the decoupling circuit is a circuit that is inserted in order to prevent the output of the detecting coil flowing to the voltage source or to the current source so that an influence by which, for example, the alternate current damped oscillation voltage is weakened is not substantially exerted, and the decoupling circuit is a circuit that decreases the degree of an electric connection between the detecting coil and the voltage source or the current source.

Additionally, the inventors of the present invention focused attention on the second technical idea of the present invention of applying an arbitrary magnetic field onto the amorphous wire by means of the magnetic field induced on the detecting coil by applying an electrical current through the single detecting coil, for detecting the alternate current damped oscillation voltage induced in response to the external magnetic field and being wound around the amorphous wire, by connecting the detecting coil to the voltage source or to the current source, through a resistor or a coil or a capacitor or an impedance network serving as a decoupling circuit composed of a combination of the resistor, the coil and the capacitor, in the magnetic impedance sensor formed of a magnetic impedance element that passes a pulse electrical current or a high frequency electrical current through the amorphous wire and that outputs an alternate current damped oscillation voltage having a magnitude in response to an external magnetic field induced by the detecting coil wound around the amorphous wire, and reached the present invention that realizes a detecting-coil output type magnetic impedance sensor that makes it possible to apply a bias magnetic field only by using a single detecting coil.

A magnetic field detecting device on a first aspect of the present invention which comprises a magnetic impedance sensor including a magnetic impedance element in which pulse or high frequency electrical current is applied to an amorphous wire, and an alternate current damped oscillation voltage is induced by a detecting coil wound around the amorphous wire in response to the external magnetic field thereof and is output from the detecting coil, and a decoupling circuit, connected to a circuit between a voltage source or current source and the detecting coil, for blocking the flow of the alternate current damped oscillation voltage to said voltage source or current source and applying the magnetic field to the amorphous wire based on the magnetic field which is induced on the detecting coil energized by the voltage source or current source.

A magnetic field detecting device on a second aspect of the present invention according to the first aspect, wherein the decoupling circuit comprises an impedance network comprising at least one or the combination of a resistor, a coil and a capacitor, and wherein a bias magnetic field is applied to the amorphous wire based on the magnetic field which is generated on the detecting coil energized through the impedance network.

A magnetic field detecting device on a third aspect of the present invention which comprises a magnetic impedance sensor including a magnetic impedance element in which pulse or high frequency electrical current is applied to an amorphous wire, and the alternate current amped oscillation voltage is induced by a detecting coil wound around said amorphous wire in response to the external magnetic field thereof and is output from said detecting coil, and a detection circuit for converting the alternate current damped oscillation voltage output from said detecting coil to the voltage signal in response to the intensity of the external magnetic field, an amplifier for amplifying the voltage signal to an amplified voltage signal having a predetermined amplitude, and an impedance network, connected to an output terminal of said amplifier in order to obtain the current and voltage, comprising at least one or the combination of a resistor, a coil and a capacitor, and wherein a feedback magnetic field is applied to the amorphous wire based on the magnetic field induced on said detecting coil energized through said impedance network, and the flow of the alternate current damped oscillation voltage output from said detecting coil to said output terminal of said amplifier is blocked by said impedance network.

A magnetic field detecting device on a forth aspect of the present invention according to the third aspect wherein the impedance network is connected to the output terminal of the amplifier through a frequency selective circuit, and wherein the feedback magnetic field selected on the frequency by the frequency selective circuit is applied to the amorphous wire.

On the magnetic field detecting device of the first aspect of the present invention having the construction described above comprising the magnetic impedance sensor, in the magnetic impedance element, the pulse or high frequency electrical current is applied to the amorphous wire, and the alternate current damped oscillation voltage is induced by the detecting coil wound around the amorphous wire in response to the external magnetic field thereof and is output from the detecting coil and in the decoupling circuit connected to the circuit between the voltage source or the current source and the detecting coil, the flow of the alternate current damped oscillation voltage to said voltage source or current source is blocked and the magnetic field is applied to the amorphous wire based on the magnetic field induced on the detecting coil energized by the voltage source and current source. Furthermore, since the flow of the alternate current damped oscillation voltage output from the detecting coil to the output terminal of the amplifier is blocked by the impedance network, it is possible to prevent the alternate current damped oscillation voltage output from the detecting coil from weakening and to maintain the detection having high accuracy equal to accuracy that has been obtained when the other coil is separately disposed in addition to the detecting coil. The magnetic field detecting device on the first aspect of the present invention does not need to use another coil to apply a magnetic field to an amorphous wire as in the conventional device and it is possible to achieve low production cost.

Therefore, the magnetic field detecting device on the first aspect of the present invention makes it possible to maintain the detection having high accuracy equal to accuracy that has been obtained when a bias coil and a feedback coil are separately disposed in addition to a conventional detecting coil so as to measure a magnetic field without using a bias coil or a feedback coil, and makes it possible to apply a magnetic field to a wire only by using a single detecting coil, and therefore, as an advantageous effect, it is possible to make the number of components and the number of production process steps smaller and to make production cost smaller than in a conventional device in which two coils are used.

On the magnetic field detecting device of the second aspect of the present invention having the construction described above, according to the first aspect of the present invention, the bias magnetic field is applied to the amorphous wire based on the magnetic field induced on the detecting coil energized through the impedance network coupling at least one or the combination of a resistor, a coil and a capacitor, that makes it possible to provide the magnetic impedance sensor in which the bias magnetic field is applied to the amorphous wire by using a single detecting coil.

Furthermore, the magnetic field detecting device on the second aspect of the present invention, as the magnetic field detecting device on the first aspect of the present invention, makes it possible to maintain the detection having high accuracy equal to accuracy that has been obtained when a bias coil and a feedback coil are separately disposed in addition to a conventional detecting coil so as to measure a magnetic field without using a bias coil or a feedback coil and to make production cost smaller than in a conventional device in which two coils are used.

On the magnetic field detecting device of the third aspect of the present invention having the construction described above, comprising the magnetic impedance sensor, in the magnetic impedance element, the pulse or high frequency electrical current is applied to the amorphous wire, and the alternate current damped oscillation voltage is induced by the detecting coil wound around the amorphous wire in response to the external magnetic field thereof, the alternate current damped oscillation voltage output from the detecting coil is converted and the converted signal is amplified the voltage signal having a predetermined amplitude by the amplifier, and the feedback magnetic field is applied to the amorphous wire based on the magnetic field induced on the detecting coil by energized through the impedance network as the decoupling circuit, comprising at least one or the combination of a resistor, a coil and a capacitor connected to the output terminal of the amplifier and the flow of the alternate current damped oscillation voltage output from said detecting coil to said output terminal of said amplifier is blocked by said impedance network. Thereby in the magnetic field detecting device it does not need to use another coil to apply a magnetic field to an amorphous wire as in the conventional device and it is possible to achieve low production cost. Furthermore, since the flow of the alternate current damped oscillation voltage output from the detecting coil to the output terminal of the amplifier is blocked by the impedance network, it is possible to prevent the alternate current damped oscillation voltage output from the detecting coil from weakening and to maintain the detection having high accuracy equal to accuracy that has been obtained when the other coil is separately disposed in addition to the detecting coil.

Therefore, it is possible to achieve improvement in linearity of the output voltage with respect to a magnetic field to be detected and magnetic detection having higher accuracy that are obtained by applying a feedback magnetic field only by use of a single detecting coil. The magnetic field detecting device on the third aspect of the present invention makes production cost smaller as the magnetic field detecting device on the first and the second aspects of the present invention.

On the magnetic field detecting device of the fourth aspect of the present invention having the construction described above, according to the third aspect of the present invention, the feedback magnetic field selected on the frequency is applied to the amorphous wire by connecting the impedance network to the output terminal of the amplifier through the frequency selective circuit.

Thereby the magnetic field detecting device on the fourth aspect of the present invention makes it possible to obtain an effect by which the signal components selected on the frequency are restrained and the only signal components not selected on the frequency are amplified and are output.

Accordingly the unnecessary signal components selected on the frequency become small, the magnetic field detecting device on the fourth aspect of the present invention makes it possible to achieve magnetic detection having higher accuracy. The magnetic field detecting device on the fourth aspect of the present invention makes production cost smaller as the magnetic field detecting device on the first through the third aspects of the present invention.

DESCRIPTION OF THE PREFERRED EMBODIMENTS

An embodiment of the present invention will be described with reference to the drawings.

EMBODIMENTS

First Embodiment

Figure 1:
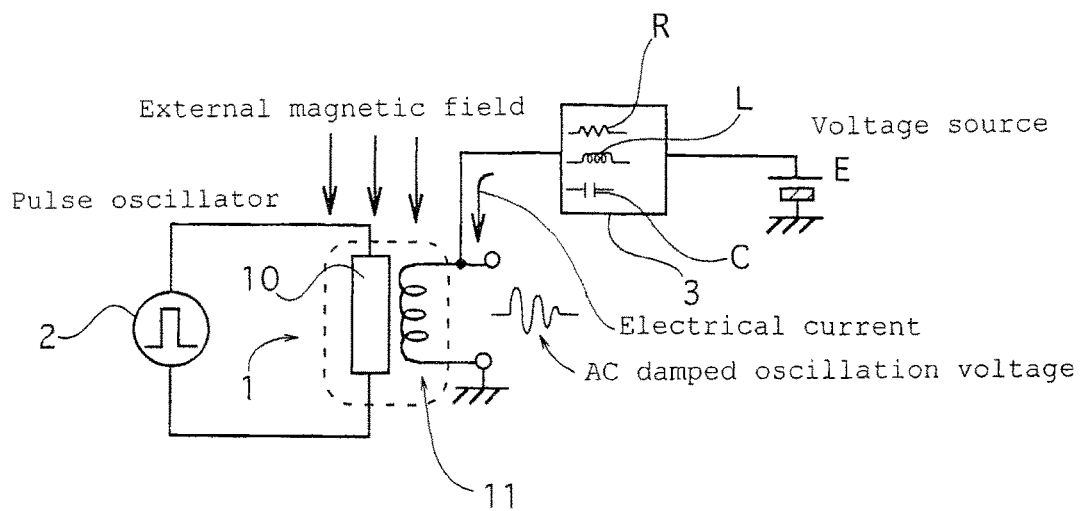
FIG. 1 is a block circuit diagram showing a characteristic part of a magnetic field detecting device on a first preferred embodiment of the present invention.

As shown in FIG. 1, a magnetic field detecting device of a first preferred embodiment comprises a magnetic impedance sensor including a magnetic impedance element 1 in which a pulse electrical current or a high frequency electrical current is applied from an oscillator 2 to an amorphous wire 10 and an alternate current or AC damped oscillation voltage, which is induced in a detecting coil 11 wound around the amorphous wire 10 and that has a magnitude corresponding to an external magnetic field, is output, and an arbitrary magnetic field is applied to the amorphous wire by means of the magnetic field generated on the detecting coil 11 energized by connecting the detecting coil 11 to a voltage source or to a current source E through an impedance network 3 that serves as a decoupling circuit comprising of a resistor R or a coil or inductor L or a capacitor C or comprising a combination of the resistor R, the coil or inductor L, and the capacitor C.

The magnetic field detecting device of the first preferred embodiment includes the magnetic impedance element 1 that applies the pulse electrical current or the high frequency electrical current to the amorphous wire 10 made of a magnetism-sensitive material and that outputs an alternate current damped oscillation voltage having a magnitude proportional to an external magnetic field induced in the detecting coil 11 wound around the amorphous wire 10, in which one end of the detecting coil 11 is connected to a voltage source or to a current source E through an impedance network 3 comprising a resistor R or a coil L or a condenser C or comprising of a combination of the resistor R, the coil L, and the condenser C.

In the first embodiment, the output terminal of the detecting coil 11 is connected to the impedance network 3 having a predetermined resistance value, and therefore the electrical current of the alternate current damped oscillation voltage as the output of the detecting coil 11 almost never flows out toward the impedance network 3, and hence is almost never subjected to a bad influence, by which, for example, the alternate current damped oscillation voltage as the output of the detecting coil 11 is weakened.

On the other hand, when an electrical current flows from the voltage source E to the detecting coil 11 through the impedance network 3 having the predetermine resistance value, the magnetic field is induced in the detecting coil 11, and therefore it is possible to apply an arbitrary magnetic bias to the amorphous wire 10.

The detecting coil 11 is made of a copper wire, and a resistance value of the detecting coil 11 is extremely low, and therefore even when an electrical current flows into the detecting coil 11, an influence is never exerted on the alternate current damped oscillation voltage as an output.

Therefore, without winding a bias coil around the magnetic impedance element 1, the magnetic field detecting device of the first preferred embodiment realizes a magnetic impedance sensor that makes it possible to perform both exact magnetic detection and a magnetic bias function by means of the single detecting coil 11.

Second Embodiment

Figure 2:
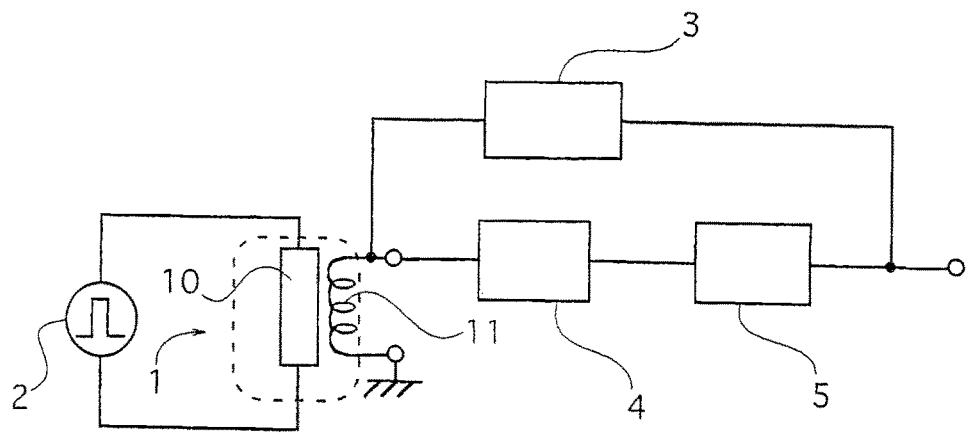
FIG. 2 is a block circuit diagram showing a characteristic part of a magnetic field detecting device on a second preferred embodiment of the present invention.

The magnetic field detecting device of the second preferred embodiment is constructed that an alternate current damped oscillation voltage output by the detecting coil 11 is converted into a magnetic signal in response to the magnitude of an external magnetic field by means of a detection circuit 4, and outputs a magnetic signal having a voltage of a predetermined magnitude amplified by an amplifier 5 as shown in FIG. 2 in the first preferred embodiment, and the detecting coil 11 is energized by connecting to an output terminal of the amplifier 5 serving as a voltage source through the impedance network 3, and a feedback magnetic field is applied to the amorphous wire 10 by means of the magnetic field induced on the detecting coil 11.

The magnetic field detecting device of the second preferred embodiment, the voltage signal in response to the detected magnetic field is amplified by means of the amplifier 5, and the amplified output is magnetically fed back to the amorphous wire 10 of the magnetism-sensitive material.

The alternate current (AC) damped oscillation voltage output by the detecting coil 11 in the first preferred embodiment is converted by the detection circuit 4 into a magnetic signal, i.e., into a voltage signal in response to the magnitude of the external magnetic field, and thereafter a magnetic signal having a predetermined magnitude amplified by the amplifier 5 is output as a voltage signal.

The detecting coil 11 is connected to an output terminal of the amplifier 5 serving as a voltage source through the impedance network 3 comprising a resistor R or a condenser C or comprising a combination of the resistor R, the coil L, and the condenser C.

As a result, in the magnetic field detecting device of the second preferred embodiment, a part of the output of the amplifier 5 flows into the detecting coil 11 through the impedance network 3 in the form of an electrical current. As a result, the a magnetic field is induced on the detecting coil 11, and therefore, without using a feedback coil, by a single detecting coil 11 makes it possible to perform both exact magnetic detection and a magnetic feedback function with respect to the amorphous wire.

Third Embodiment

Figure 3:
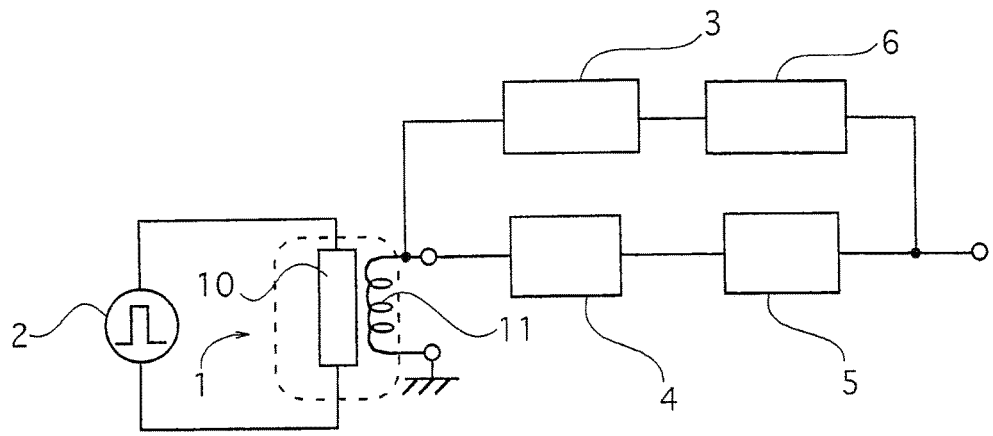
FIG. 3 is a block circuit diagram showing a characteristic part of a magnetic field detecting device on a third preferred embodiment of the present invention.

In the magnetic field detecting device of the third preferred embodiment, the impedance network 3 is connected to the output terminal of the amplifier 5 through a frequency selective circuit 6 as shown in FIG. 3 in the second preferred embodiment, and, as a result, a feedback magnetic field selected in the frequency is applied to the amorphous wire 10.

In the magnetic detecting device of the third preferred embodiment, only a specific frequency signal component is selected from among output signals of the amplifier 5 and is allowed to pass through, and, as a result, magnetic feedback to the amorphous wire 10 is performed.

In the third preferred embodiment, the impedance network 3 is connected to the output terminal of the amplifier 5 through the frequency selective circuit 6. As a result, only a frequency signal component selected by the frequency selective circuit 6 among magnetic signals, i.e., among voltage signals output by the amplifier 5 flows into the detecting coil 11 through the impedance network 3, and magnetic feedback is performed.

Therefore, the magnetic field detecting device of the third preferred embodiment makes it possible to perform both exact magnetic detection and frequency selective magnetic feedback function to the amorphous wire 10 by using a single detecting coil without using a feedback coil addition to the detecting coil.

Therefore, the magnetic field detecting devices of the first to third preferred embodiments make it possible to perform magnetic bias or magnetic feedback to the amorphous wire 10 only by using a single detecting coil 11 without winding a bias coil or a feedback coil around the magnetic impedance element 1, and make it possible to reduce the number of components of the magnetic impedance element and the number of production process steps by reducing the number of coils to one, and make it possible to achieve low production cost by facilitating production so as to reduce the number of occurrences of a incomplete or defective article.

First Example

Figure 4:
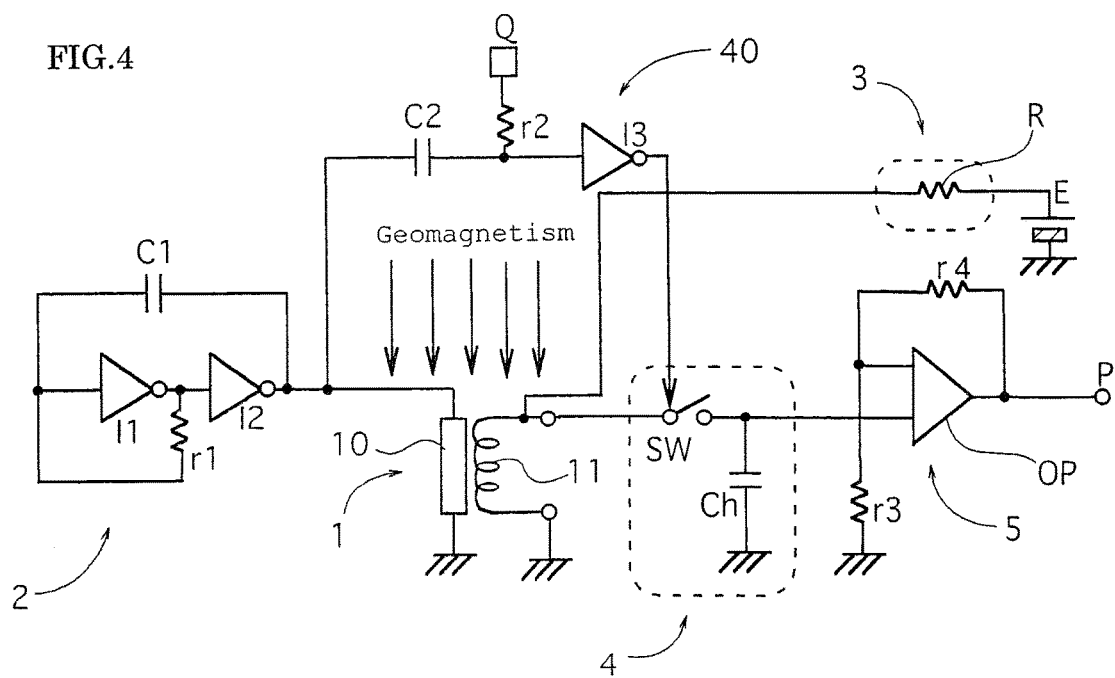
FIG. 4 is a detailed circuit diagram showing the details of a magnetic field detecting device on a first example of the present invention.

As shown in FIG. 4, the magnetic field detecting device of the first example comprises a magnetic impedance sensor including a magnetic impedance element 1 in which a pulse electrical current is applied to the amorphous wire 10 from a pulse oscillator 2 and an alternate current damped oscillation voltage having a magnitude, which is induced by the detecting coil 11 wound around the amorphous wire 10 in response to the external magnetic field thereof, is output from the detecting coil, and the detecting coil 11 is energized by being connected to a voltage source or to a current source E through a high impedance circuit 3 comprising a resistor R or a coil L or a condenser C or a combination of the resistor R, the coil L, and the condenser C (FIG. 4 shows an example which comprises only the resistor R), and an arbitrary bias magnetic field is applied to the amorphous wire 10 by means of the magnetic field induced in the detecting coil 11.

The magnetic field detecting device of the first example is based on the aforementioned first and second aspects and based on the first preferred embodiment, and its technical problem i.e., its object is to observe a slight variation component of earth magnetism or geomagnetism, and the (typical) mean value of geomagnetism is 45 μT (micro Tesla), and the magnetic variation value is several tens of nT (nano Tesla) and is about 1/1000 of the mean value.

When an extremely slight magnetic variation with respect to the average strength of geomagnetism is detected, the output of an amplifier, i.e., the output of a magnetic sensor is saturated by the mean value component of large geomagnetism, and it becomes impossible to detect the slight variation magnetic signal to be objected.

In order to avoid this problem, an electrical current is applied to the detecting coil 11 from the voltage source E through the high impedance circuit 3 to apply the magnetic bias which is equal in level to the average geomagnetic component and that is opposite in polarity thereto.

Thereby a magnetic field is induced in the detecting coil 11 and is applied to the amorphous wire 10, and therefore the mean value component of geomagnetism in the amorphous wire 10 is canceled, and it is possible to achieve a highly-sensitive magnetic detecting device which achieves the purpose of detecting a slight magnetic variation component without allowing the amplifier to be saturated.

As shown in FIG. 4, in the magnetic field detecting device of the first example, the pulse oscillator 2 comprises a multivibrator type pulse oscillation circuit, in which a pulse electrical current having a predetermined period manner is applied to the amorphous wire 10.

The pulse oscillator 2 is a multivibrator comprises a logic IC, i.e., logical circuits I1 and I2, a resistor r1 and condenser C1 connected between each input and output terminal of the logic IC as shown in FIG. 4.

A timing circuit 40 is connected to the output terminal of the pulse oscillator 2 and outputs a switch signal to open and close an analog switch SW at a predetermined timing synchronized with a pulse electrical current applied from the pulse oscillator 2.

The timing circuit 40 includes a condenser C2, one end of which is connected to the output terminal of the pulse oscillator 2, a resistor r2, which is connected to the other end of the condenser C2 and to a circuit power source Q, and a logic element, the input terminal of which is connected to the other end of the condenser C2. A switch signal to open and close an analog switch SW at a predetermined timing synchronized with the pulse electrical current applied from the pulse oscillation circuit 2 is output by the timing circuit 40.

The high impedance circuit 3 is connected to the voltage source E from which a set output voltage or a set output current is output, and comprises the resistor R, or the coil L, or the condenser C or a combination of the resistor R, the coil L, and the condenser C, and is connected to the output terminal of the detecting coil 11, so that the set output voltage or the set output current is output to the detecting coil 11.

The detection circuit 4 is connected to the output terminal of the detecting coil 11, and opens and closes the analog switch SW at a predetermined timing based on a switch signal sent from the timing circuit, and, as a result, samples and holds the detection output, i.e., the alternate current damped oscillation voltage of the detecting coil 11, and then converts it into a voltage signal in response to a magnetic signal, and stores it in a hold condenser Ch as a voltage.

The amplifier 5 comprises an OP amplifier in which one input terminal is connected to the output terminal of the detection circuit 4 and the other input terminal is connected to a resister 3 connected to an earth and a resistor r4 connected to the output terminal thereof, and the voltage signal serving as the magnetic signal stored in the hold condenser Ch is amplified to a predetermined magnitude, and is output from the output terminal P.

When an average geomagnetic component and a slight magnetic variation component to be detected are existed around the magnetic impedance element 1, the magnetic field Bw inside the amorphous wire 10 corresponding thereto is the sum of Be (component in response to the average magnetic field) and Bs (component in response to the variation magnetic field), i.e., is equal to Be+Bs.

In a case the high impedance circuit 3 in the first example comprises, for example, only a resistor, a resistance value of which is an impedance (resistance value) higher than the impedance of the detecting coil and a predetermined electrical current is set to achieve predetermined magnetic bias, is used, and an electrical current is applied from the power source E to the detecting coil 11 through the high impedance circuit 3.

Magnetic bias −Bb that is equal in magnitude to the mean value of geomagnetism and that is opposite in direction thereto is generated in the amorphous wire 10 by means of the detecting coil 11 of the magnetic impedance element 1 (|Bb|=|Be|), and therefore a relationship shown in the following mathematical formula is become.

$$Bw=Be+Bs-Bb=Bs \quad \text{[Formula 1]}$$

As a result, the average magnetic field Be inside the amorphous wire 10 and the bias magnetic field Bb by the detecting coil 11 are canceled by each other, and therefore only the variation magnetic field Bs remains and exists in the amorphous wire 10.

When a pulse electrical current is applied to the amorphous wire 10 by means of the pulse oscillator 2 comprising I1, I2, c1, and r1, the analog switch SW is opened and closed at a predetermined timing by means of the timing circuit 40 comprising I3, c2, and r2, and therefore the detection circuit 4 comprising the hold condenser Ch stores an alternate current damped oscillation voltage T in response to the variation magnetic field Bs at both ends of the detecting coil 11, i.e., a magnetic signal voltage in response to the variation magnetic field Bs in the hold condenser Ch, and therefore the stored magnetic signal voltage in response to the variation magnetic field Bs is amplified to a predetermined magnitude by means of the amplifier 5, and is output from the output terminal P.

As described above, the magnetic field detecting device of the first example performs both the function of the output in response to measurement field strength and the function of magnetic bias to cancel offsets an average magnetic field component by means of the single detecting coil 11 of the magnetic impedance element 1, and, as a result, it is possible to perform the measurement of a slight magnetic field variation of geomagnetism in which two coils have been conventionally used, and, as an advantageous effect, it is possible to achieve production simplification and a production cost reduction by reducing the number of components, and, when the high impedance circuit 3 comprises only a resistor, it is advantageously possible to perform magnetic detection without depending on frequency.

In other words, although the magnetic detecting device of the first example uses a magnetic impedance element having only one detecting coil, it has become possible to realize a highly-sensitive magnetic detecting device having a resolution of 1 nT corresponding to almost 1/50000 in the environment of a mean value of 45 μT (micro Tesla) of geomagnetism.

Figure 5:
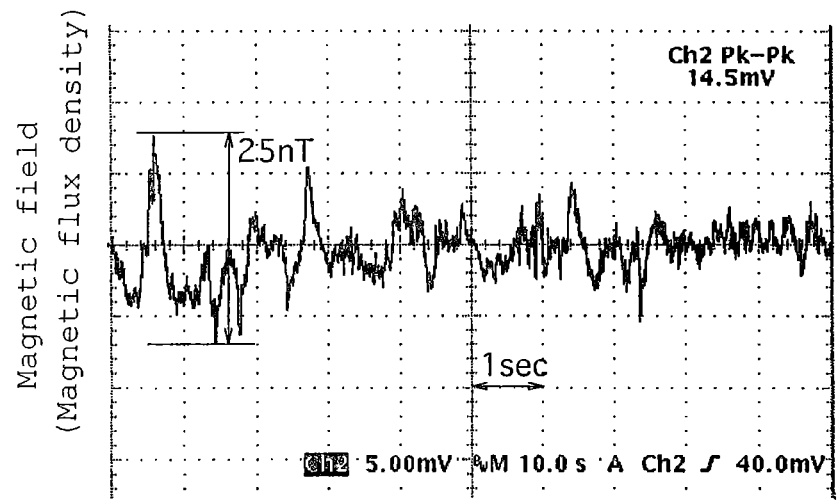
FIG. 5 is a diagram showing a measurement example of a geomagnetic variation component in the first example of the present invention.

When the variation signal of geomagnetism was measured in the magnetic field detecting device of the first example, an actual measurement value of 25 nano Tesla (nTpp) in the peak-to-peak value was obtained as shown in the diagram of FIG. 5 of magnetic flux density (nT, nano Tesla) in which the horizontal axis represents time (sec) and the vertical axis represents a magnetic field.

The magnetic field detecting device of the first example is suitable for a magnetic detecting device as a device for researching magmatic activities, earthquake anticipation, solar radiation, etc., based on a variation in geomagnetism.

Second Example

Figure 6:
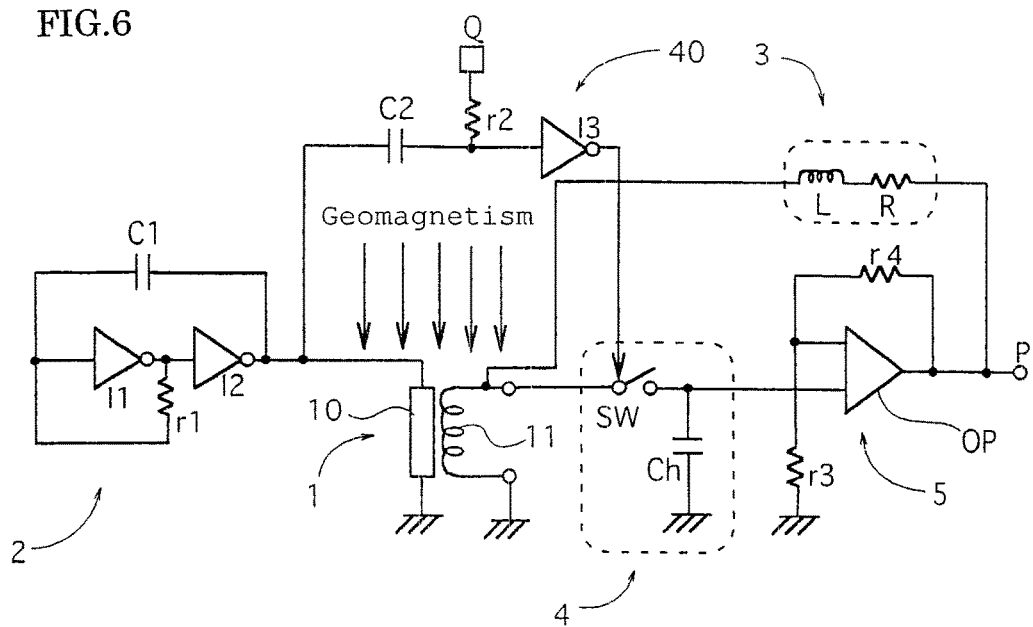
FIG. 6 is a detailed circuit diagram showing the details of a magnetic field detecting device on a second example of the present invention.

The magnetic field detecting device of the second example aims to realize a favorable linearity and highly accurate magnetic measuring device, and, as shown in FIG. 6, differs from the aforementioned first example in the fact that one end of the high impedance circuit 3 in the first example shown in FIG. 4 is connected to the output terminal P of the amplifier 5 and in the fact that the high impedance circuit 3 comprises a series circuit including a resistor R and a coil L, and a description of the same part is omitted while being focused on the different part hereinafter.

The magnetic field detecting device of the second example is based on the third aspect and the second preferred embodiment, and is constructed to be a highly accurate magnetic field detecting device.

The amplifier 5 comprises an operational amplifier in which its one input terminal is connected to the output terminal of the detection circuit 4 and the other input terminal is connected to a resistor r3 connected to the earth and a resistor r4 connected to its output terminal, and the voltage signal serving as the magnetic signal stored in the hold condenser Ch is amplified to a predetermined magnitude, and is output from the output terminal P.

On the other hand, the second example is constructed that a part of the output signal of the amplifier 5 is applied to the detecting coil 11 through the impedance network 3 which is a series circuit comprises the resistor R and the coil L, and magnetically-negative feedback is applied to the amorphous wire 10.

The negative feedback is based on a so-called null-balance method, and is constructed to work to always keep the working point of the amorphous wire 10 as a magnetism-sensitive material to be at a substantially constant magnetic level (at almost zero).

The second example is capable of improving linear characteristic concerning the linearity of an output signal with respect to an input magnetic field which is a factor to determine performance as a magnetic field detecting device, and thus is capable of realizing a more highly accurate magnetic field detecting device.

In the second example, the high impedance circuit 3 comprises a series circuit comprising of the resistor R and the coil L, and therefore the coil L exhibits high impedance because the alternate current damped oscillation voltage is high frequency, and an influence afforded on the output of the detecting coil becomes slighter, and therefore it is suitable to achieve more highly accurate magnetic field detection. Additionally, the resistance value of the resistor R is set to realize the function of the predetermined feedback.

The magnetic field detecting device of the second example makes it possible to perform both the function of the output corresponding to the magnitude of an original magnetic field and the function of negative feedback by means of the single detecting coil of the magnetic impedance element, and therefore it became possible to make the number of components smaller than in a conventional example in which two coils are necessary, and therefore production was facilitated, and production cost was reduced, and it became possible to realize a highly accurate magnetic field detecting device based on the null-balance method.

Figure 7:
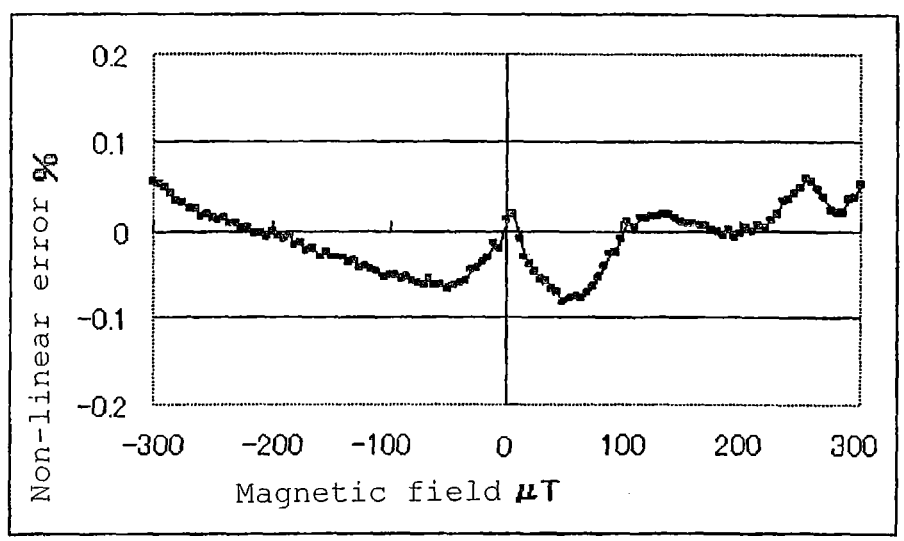
FIG. 7 is a diagram showing a measurement example in which a non-linear error is 0.1% or less in the second example of the present invention.

In the magnetic field detecting device of the second example, when a non-linear error was measured to express a deviation from an ideal value in order to confirm the degree at which a highly accurate magnetic detecting device is realized, a measurement example in which the non-linear error is 0.1% or less was obtained as shown in the diagram of FIG. 7 in which the horizontal or abscissa axis represents an applied magnetic field (μT, micro Tesla) and the vertical or ordinate axis represents a non-linear error (%).

The magnetic detecting device of the second example is suitable as a highly accurate magnetic detecting device, such as a highly accurate magnetic measurement device or a magnetic obstacle measuring device used in physical and chemistry research.

Third Example

The magnetic field detecting device of the third example is to realize a highly-sensitive alternate current magnetic field detecting device in which weak magnetism emitted from, for example, fine pieces of iron inserted or mixed in a product conveyed by a conveyance means, such as a belt conveyor, is detected so as to find out the foreign substances.

The magnetic field detecting device of the third example is based on the fourth aspect of the present invention and the third embodiment, and is constructed to perform highly-sensitive alternate current magnetic field detection.

In other words, when an inspected object, which has the possibility of containing foreign substances, such as magnetized pieces of iron, is passed through a detection area by means of a belt conveyor, an alternate current magnetic variation will occur during conveyance if the magnetized foreign substances are contained in the inspected object.

At this time, the amount of the detected magnetic variation is slight because foreign substances inserted or mixed therewith are usually small in size, and therefore a highly-sensitive alternate current magnetic field detecting device is necessary.

Figure 8:
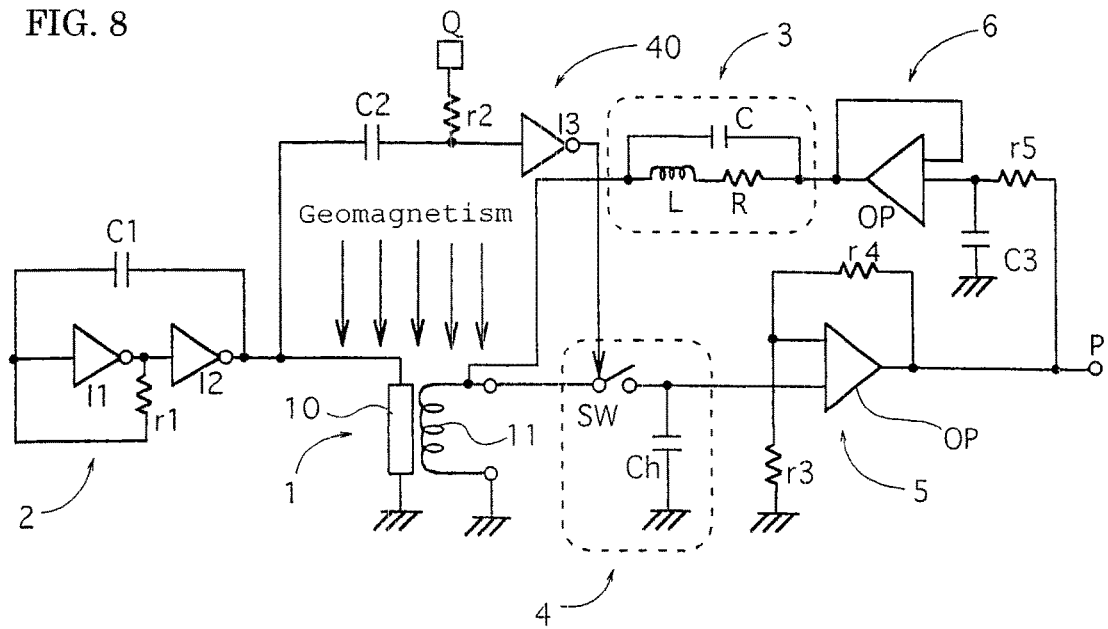
FIG. 8 is a detailed circuit diagram showing the details of a magnetic field detecting device on a third example of the present invention.

The magnetic field detecting device shown in FIG. 8 is a third example differs from the aforementioned examples in the fact that the high impedance circuit 3 comprises the resistor R, the coil L, and the condenser C in comparison with the second example shown in FIG. 6 and in the fact that an impedance network is formed by inserting a resistor r5 and a frequency selective circuit 6 comprising a low-frequency passing filter circuit in which cut-off frequency is determined by the condenser C3 and a buffer circuit by an operational amplifier OP between one terminal of the high impedance circuit 3 and the output terminal P of the amplifier 5, and a description of the same part is omitted while being focused on the different part hereinafter.

The detected magnetic signal is output from the output terminal P of the amplifier 5, and a part of the detected magnetic signal selected by the frequency selective circuit 6, i.e., only a low-frequency magnetic signal component containing a direct current is allowed to pass through in this example, and magnetically-negative feedback is applied onto the amorphous wire 10 through the high impedance circuit 3.

Generally, a voltage signal in response to the detected magnetic signal is amplified by the amplifier 5, and is output from the output terminal P, and, when the part of its signal is negatively fed back, the magnitude (voltage) of the output signal becomes small.

When the amount of feedback is set at a predetermined value, it is possible to lower a magnetic signal in the output terminal P of the amplifier 5 of the frequency component that has selected on the frequency and feedback to a negligible small level.

In other words, the magnetic detection sensitivity with respect to the selected signal on the frequency becomes extremely low.

As described above, in the third example, the frequency selective circuit 6 allows a low frequency signal component of cut-off frequency that includes a direct current like geomagnetism and that is determined by the condenser C3 and the resistor r5 to pass through and feeds back it, and therefore a signal component corresponding thereto the low frequency hardly appears in the output terminal P of the amplifier 5.

On the other hand, an alternate current signal component of the magnetic signal which was not able to pass through the frequency selective circuit 6 (which is higher than cut-off frequency determined by the condenser C3 and the resistor r5) does not undergo negative feedback. Therefore, this signal component of a high frequency is amplified to predetermined amplification in the amplifier 5, and is output from the output terminal P, and therefore the detectability is high, and therefore it is possible to realize a highly-sensitive alternate current magnetic field detecting device that highly sensitively detects only an alternate current magnetic signal component of a high frequency band without detecting a magnetic component of a direct current like geomagnetism or of low frequency.

Although a circuit, in which a circuit including the resistor R and the coil L that are connected in series and the condenser C are connected in parallel, is used as the high impedance circuit 3 herein, the condenser C attain to raise stability so that the feedback circuit does not oscillate.

In the highly-sensitive alternate current magnetic field detection unit of the third example, a magnetic variation caused by the fact that magnetized foreign substances, such as pieces of iron, are conveyed by a conveyor is an alternating current having a frequency component of 10 Hz or more, and therefore the impedance of the condenser C3, that of the resistor r5, and that of the high impedance circuit 3 are each determined to select a predetermined value, and, as a result, the frequency band to be detected is set at 5 Hz or more, and the detectability of the frequency band between a direct current and less than 5 Hz is set at zero or at an extremely low value by means of feedback. Herein, the reason why the detectability of the frequency band less than 5 Hz is set at about zero is that a magnetic variation of a low frequency component caused by a variation in geomagnetism or by a carrier car moving in a factory is prevented from being falsely detected.

Additionally, it is possible to construct a magnetic detecting device that detects only the magnetic signal of a specific frequency band by using a band-stop filter (which is a filter that stops the signal of a frequency component of a band ranging from first frequency to second frequency) as the frequency selective circuit 6.

In a security gate to discover the carrying of arms, such as guns or knives, it is possible to discover it by detecting a magnetic variation caused by the movement of arms, i.e., the movement of pieces of iron. In other words, when a person walks and passes through the security gate, the detected frequency component is distributed in the frequency band of about 0.1 Hz to 20 Hz.

Therefore, it is possible to realize a magnetic detecting device having properties in which the magnetic signal component of a frequency band from a direct current to 0.1 Hz and of a frequency band of 20 Hz or more is fed back by using a band-stop filter as the frequency selective circuit 6 in order to detect only the magnetic signal of a frequency band between 0.1 Hz and 20 Hz, and the detectability in these frequency bands is adjusted at 0 or at almost 0.

The reason why the magnetic signal component of the frequency band of less than 0.1 Hz and the magnetic signal component of the frequency band of greater than 20 Hz are not detected is that unnecessary magnetic noises distributed in these frequency bands are not falsely detected.

The highly-sensitive alternate current magnetic field detecting device of the third example makes it possible to perform both the highly accurate magnetic field detection and the frequency selection magnetic feedback function by means of the single detecting coil 11 of the magnetic impedance element 1, and, as an advantageous effect, production is facilitated, and production cost is reduced, and it becomes possible to perform highly-sensitive alternate current magnetic field detection.

Figure 9:
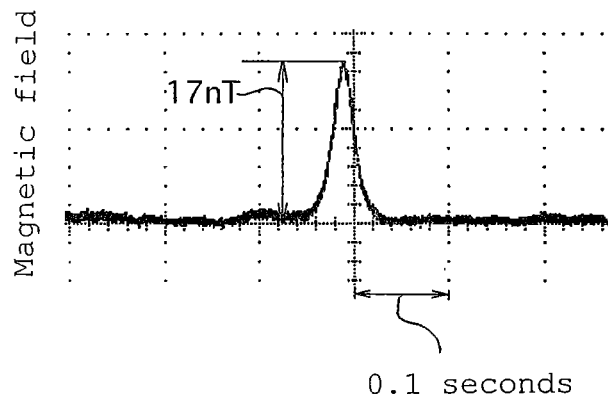
FIG. 9 is a diagram showing an example in which the movement of an iron ball of 0.3 mm φ is detected 10 mm apart from the iron ball in the third example of the present invention.

In the highly-sensitive alternate current magnetic field detecting device of the third example, an example in which the movement of an iron ball of 0.3 mm $\phi$ was detected on the position 10 mm apart from the iron ball is shown in FIG. 9 and in which the horizontal axis represents time (sec), the vertical axis represents a magnetic field (nT, nano Tesla), and a peak of 17 nT was detected.

The highly-sensitive alternate current magnetic field detecting device of the third example is suitable for the detection on the application such as foreign substances contained in foods or suitable for a security gate.

The preferred embodiments of the present invention, as herein disclosed, are taken as some embodiments for explaining the present invention. It is to be understood that the present invention should not be restricted by these embodiments and any modifications and additions are possible so far as they are not beyond the technical idea or principle based on descriptions of the scope of the patent claims.

Although the construction in which the high impedance circuit 3 is formed only of the resistor R has been described as one example from the viewpoint of making the arrangement simple in the aforementioned first example, the present invention is not limited to this, and a high impedance circuit may be formed by using a coil L or a condenser C other than the resistor R or by combination of two or more resistors R, coils L, or condensers C together.

This point applies also to the second example and the third example, and the present invention is not limited to the high impedance circuits shown in these three examples, and it is possible to produce a high impedance circuit by variously combination of resistors, coils, and condensers together.

Although the construction in which a circuit and a device are not provided to be connected to the differential amplifier 5 serving as a signal processing circuit has been described as one example in the aforementioned examples, the present invention is not limited to this, and, when a comparator circuit is additionally connected to the output terminal P of the differential amplifier 5 and when a magnetic noise, i.e., an output signal output from the output terminal P of the signal processing circuit has a magnitude greater than a reference voltage, it is possible to employ an aspect in which a notification-imparting means is used to impart notification while a light emitting diode connected to the output terminal of the comparator circuit emits light or it is possible to employ a display device that always displays detection results of foreign substances and examination results on a display when an examination is made or when necessary.

Although an arrangement in which the opening and closing timing of the analog switch of the sample-hold circuit is set so that the switch is closed by a pulse electrical current that has a synchronous relationship with a pulse electrical current applied to the amorphous wire 10 by means of the single pulse oscillator 2 has been described as one example in the aforementioned examples, the present invention is not limited to this, and it is possible to employ an opening and closing timing at which the analog switch of the sample-hold circuit is closed prior to or slightly later than a pulse electrical current applied to the amorphous wire 10 by means of one or two pulse oscillators 2.

Although an arrangement in which the high impedance circuit that has higher impedance than the impedance of the detecting coil serving as a decoupling circuit is connected between the voltage source and the detecting coil has been described in the aforementioned examples, the present invention is not limited to this, and it is possible to employ an embodiment that realizes substantially the same operation/effect as in the aforementioned examples by using a circuit, which has almost the same impedance value as the impedance of the detecting coil, as a decoupling circuit even if it is impossible to technically say that the circuit is a high impedance circuit.

Additionally, when the output impedance (resistance) of each of the power circuit, the amplifier circuit, the filter circuit, etc., that are actually used in the examples, has an impedance value adequate to serve as an impedance network in the aforementioned examples, it is possible to employ the example in which an impedance net serving as the decoupling circuit in the aforementioned examples is not newly added by allowing it to function as the impedance network in the aforementioned examples by means of the impedance of each of the power circuit, the amplifier circuit, the filter circuit, etc.

In the first aspect of the present invention, although the flow of an alternate current damped oscillation voltage is blocked by the decoupling circuit connected between the voltage source or the current source (e.g., which outputs the voltage or electrical current of the power circuit, the amplifier circuit, the filter circuit, etc.) and the detecting coil, and a magnetic field is applied to the amorphous wire by means of the magnetic field generated in the coil by applying an electrical current from the voltage source or from the current source to the coil, the term "blocked" mentioned here does not denote only a case in which the flow is completely blocked, and it also includes a case in which the outflow of the alternate current damped oscillation voltage to the voltage source or to the current source is slight, and substantially no influence is exerted on the alternate current damped oscillation voltage, and substantially no influence occurs in magnetic field detection although the flow of the alternate current damped oscillation voltage is not completely blocked by the decoupling circuit.

Although the construction in which a high impedance circuit having impedance higher than the impedance of the detecting coil is used as the decoupling circuit connected between the voltage source or the current source and the detecting coil has been described in the aforementioned examples, the present invention is not limited to this, and it is possible to employ first and second modifications that use a high frequency blocking circuit 7 that differs from the aforementioned high impedance circuit and that is capable of blocking the flow of a high frequency signal, which is characterized by that the alternate current damped oscillation voltage of the output of the magnetic impedance element is usually a high frequency voltage signal of 10 MHz or more, toward the voltage source and that is capable of passing a feedback signal to apply a bias magnetic field onto the amorphous wire by means of the magnetic field generated in the detecting coil by energizing the detecting coil that is a low frequency signal.

Figure 10:
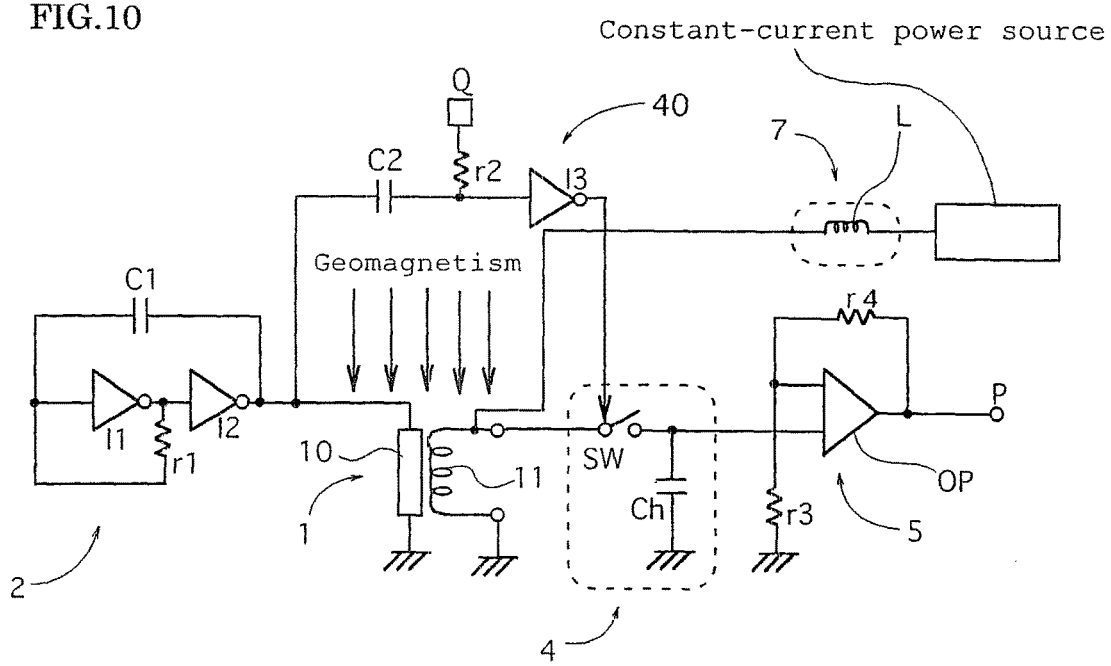
FIG. 10 is a detailed circuit diagram showing the details of a magnetic field detecting device on a first modification of the present invention.
Figure 11:
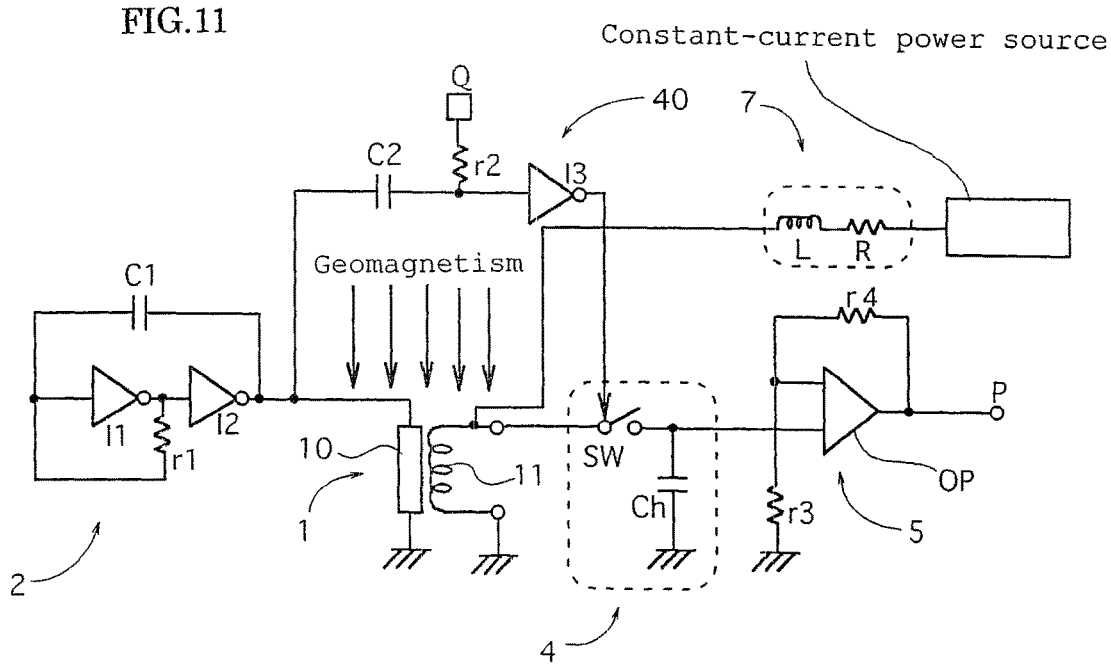
FIG. 11 is a detailed circuit diagram showing the details of a magnetic field detecting device on a second modification of the present invention.

In other words, the high frequency blocking circuit 7 serving as a decoupling circuit comprises, for example, the coil L (first modification) shown in FIG. 10 or the coil L and the resistor R are connected in series (second modification) shown in FIG. 11, and is inserted into a circuit between the detecting coil 11 and the current source.

Figure 12:
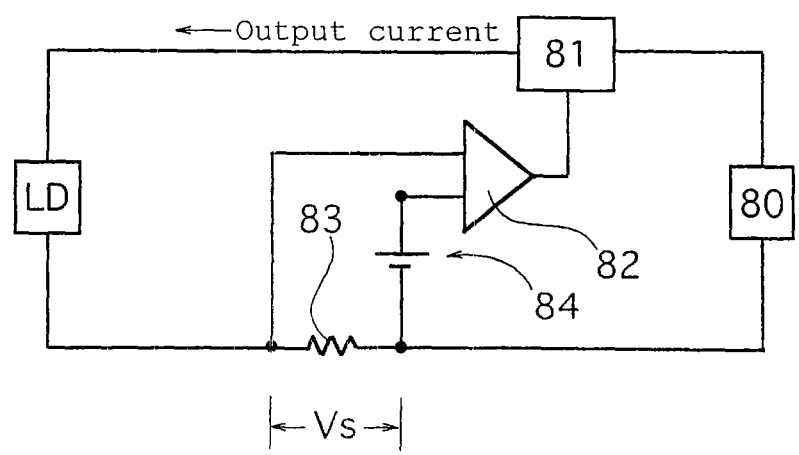
FIG. 12 is a block diagram showing an example of a constant-current power source in the first and second modifications.
Figure 13:
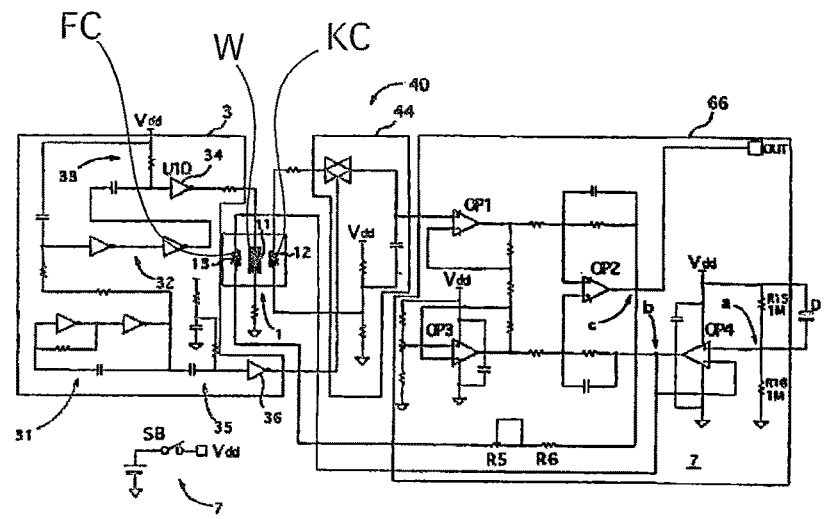
FIG. 13 is a block circuit diagram showing a conventional magnetic impedance sensor.
Figure 14:
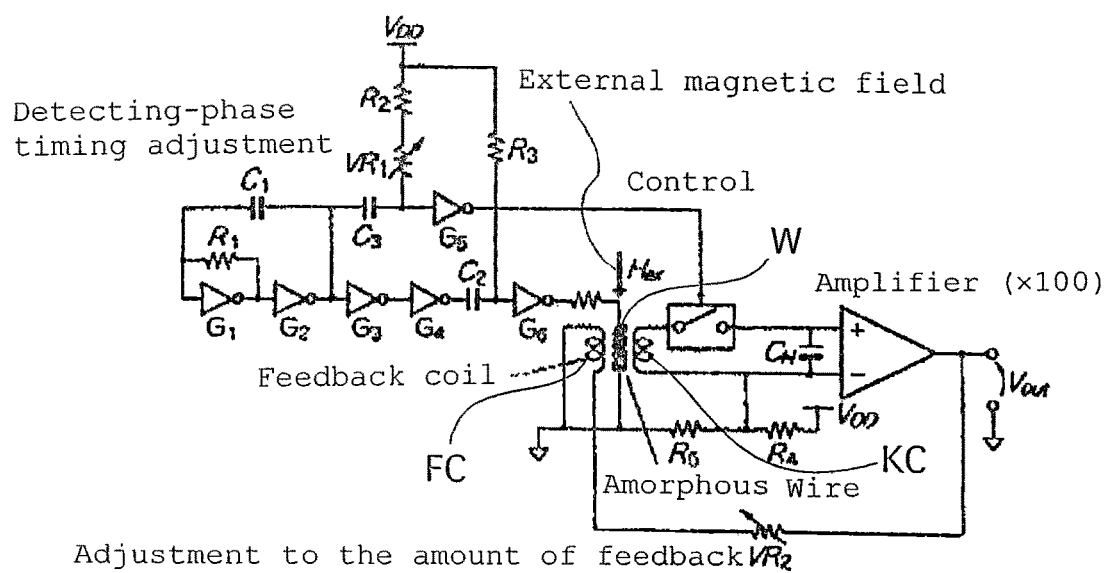
FIG. 14 is a detailed circuit diagram showing the conventional magnetic impedance sensor.

For example, as shown in FIG. 12, the current source is constructed such that a power source 80 is connected to a load LD through a control circuit 81 that controls an output current, and the reference voltage Vr of a reference voltage source 84 is output to one input terminal of an error amplifier 82, and a detecting voltage Vs generated when the output current of the power source 80 flows to an electrical current detection resistor 83 is output to the other input terminal of the error amplifier 82, and the error amplifier 82 outputs a control signal to the control circuit 81 so that the reference voltage Vr and the detecting voltage Vs always become equal to each other, and hence a constant-current power source 8 supplies a stable output current to the load LD.

The high frequency blocking circuit 7 constructed as above blocks the flow of a high-frequency alternate current damped oscillation voltage signal toward the current source, and applies a bias magnetic field onto the amorphous wire by allowing a low-frequency feedback signal to flow to the detecting coil, and the same operation/effect as in the aforementioned examples is achieved by attaining substantially no problematic influence upon the alternate current damped oscillation voltage that is a detection signal in order to perform accurate magnetic field detection, and it operates in relation to the frequency, and therefore it is possible to also say that it is a so-called filter of a type that makes no consumption in the coil.

In the present invention, a transformer or inductive coupling circuit, an optical coupling circuit, a high frequency coupled circuit, a filter circuit, and other circuits such as capacitive coupling circuit can be appropriately used as the decoupling circuit, besides the resistor R, the coil L, and the condenser C.

The present invention is applicable to magnetic detection of a research device, such as magmatic activity, earthquake anticipation, and solar radiation, based on a variation in geomagnetism, is applicable to a highly accurate magnetic measurement device in physical and chemistry research, is applicable to highly accurate magnetic detection by, for example, a magnetic obstacle measuring device, is applicable to detection of foreign substances contained in foods, is applicable to the reading of magnetic patterns in a security gate or a magnetic card, and is applicable to the inspection of magnetic patterns of a bank note.

What is claimed is:

1. A magnetic field detecting device comprising:
a magnetic impedance sensor including a magnetic impedance element in which pulse or high frequency electrical current is applied to an amorphous wire, and an alternate current damped oscillation voltage is induced by a detecting coil wound around said amorphous wire in response to the external magnetic field thereof and is output from said detecting coil; and
a decoupling circuit, connected to a circuit between a voltage source or current source and said detecting coil, configured to block the flow of the alternate current damped oscillation voltage to said voltage source or current source and configured to apply the magnetic field to said amorphous wire based on the magnetic field which is induced on said detecting coil energized by said voltage source or current source.

2. The magnetic field detecting device according to claim 1, wherein
said decoupling circuit comprises an impedance network comprising at least one or the combination of a resistor, a coil and a capacitor; and
a bias magnetic field is applied to said amorphous wire based on the magnetic field which is induced on said detecting coil energized through said impedance network.

3. A magnetic field detecting device comprising:
a magnetic impedance sensor including a magnetic impedance element in which pulse or high frequency electrical current is applied to an amorphous wire, and the alternate current damped oscillation voltage is induced by a detecting coil wound around said amorphous wire in response to the external magnetic field thereof and is output from said detecting coil;
a detection circuit configured to convert the alternate current damped oscillation voltage output from said detecting coil to the voltage signal in response to the intensity of the external magnetic field;
an amplifier configured to amplify the voltage signal to an amplified voltage signal having a predetermined amplitude; and
an impedance network, connected to an output terminal of said amplifier in order to obtain the current and voltage, comprising at least one or the combination of a resistor, a coil and a capacitor, wherein
a feedback magnetic field is applied to said amorphous wire based on the magnetic field induced on said detecting coil energized through said impedance network, and
the flow of the alternate current damped oscillation voltage output from said detecting coil to said output terminal of said amplifier is blocked by said impedance network.

4. The magnetic field detecting device according to claim 3, wherein
said impedance network is connected to said output terminal of said amplifier through a frequency selective circuit; and
the feedback magnetic field selected on the frequency by said frequency selective circuit is applied to said amorphous wire.

* * * * *